US007315999B2

(12) United States Patent
Melvin, III et al.

(10) Patent No.: US 7,315,999 B2
(45) Date of Patent: *Jan. 1, 2008

(54) METHOD AND APPARATUS FOR IDENTIFYING ASSIST FEATURE PLACEMENT PROBLEMS

(75) Inventors: Lawrence S. Melvin, III, Hillsboro, OR (US); Benjamin D. Painter, Tigard, OR (US)

(73) Assignee: Synopsys, Inc., Mountain View, CA (US)

( * ) Notice: Subject to any disclaimer, the term of this patent is extended or adjusted under 35 U.S.C. 154(b) by 322 days.

This patent is subject to a terminal disclaimer.

(21) Appl. No.: 11/109,533

(22) Filed: Apr. 19, 2005

(65) Prior Publication Data

US 2006/0236296 A1 Oct. 19, 2006

Related U.S. Application Data

(63) Continuation-in-part of application No. 11/083,656, filed on Mar. 17, 2005, now Pat. No. 7,243,332.

(51) Int. Cl.
*G06F 17/50* (2006.01)
*G06F 19/00* (2006.01)
*G21K 5/00* (2006.01)
*G03F 1/00* (2006.01)

(52) U.S. Cl. .......................... 716/20; 716/21; 700/98; 700/119; 700/120; 700/121; 430/5; 378/35

(58) Field of Classification Search .................. 716/19, 716/20, 21; 700/98, 110, 120, 121; 430/5; 378/35
See application file for complete search history.

(56) References Cited

U.S. PATENT DOCUMENTS

| | | | | |
|---|---|---|---|---|
| 5,663,893 A | * | 9/1997 | Wampler et al. ............... | 716/19 |
| 6,214,494 B1 | * | 4/2001 | Bula et al. ....................... | 430/5 |
| 6,453,457 B1 | * | 9/2002 | Pierrat et al. .................. | 716/19 |
| 6,826,733 B2 | * | 11/2004 | Hathaway et al. .............. | 716/2 |
| 7,043,712 B2 | * | 5/2006 | Mukherjee et al. ........... | 716/19 |
| 7,073,162 B2 | * | 7/2006 | Cobb et al. .................... | 716/20 |
| 7,233,887 B2 | * | 6/2007 | Smith ............................. | 703/2 |
| 7,237,221 B2 | * | 6/2007 | Granik et al. .................. | 716/19 |

(Continued)

OTHER PUBLICATIONS

Collica, "The Effect of the NUmber of Defect Mechanisms on Fault Clustering and its Detection Using Yield Model Parameters", IEEE Transactions on Semiconductor Manufacturing, vol. 5, No. 3, Aug. 1992, pp. 189-195.*

*Primary Examiner*—Phallaka Kik
(74) *Attorney, Agent, or Firm*—Park, Vaughan & Fleming LLP

(57) ABSTRACT

One embodiment of the present invention provides a system that identifies an area in a mask layout which is likely to cause manufacturing problems due to a missing or an improperly placed assist feature. During operation, the system receives an uncorrected or corrected mask layout. The system then dissects the mask layout into segments. Next, the system identifies a problem area associated with a segment using a process-sensitivity model which can be represented by a multidimensional function that captures process-sensitivity information. Note that identifying the problem area allows a new assist feature to be added or an existing assist feature to be adjusted, thereby improving the wafer manufacturability. Moreover, using the process-sensitivity model reduces the computational time required to identify the problem area.

20 Claims, 8 Drawing Sheets

U.S. PATENT DOCUMENTS

| | | | |
|---|---|---|---|
| 2002/0100004 A1* | 7/2002 | Pierrat et al. | 716/5 |
| 2003/0084420 A1* | 5/2003 | Aton et al. | 716/19 |
| 2003/0226122 A1* | 12/2003 | Hathaway et al. | 716/2 |
| 2003/0237064 A1* | 12/2003 | White et al. | 716/5 |
| 2004/0221255 A1* | 11/2004 | Pierrat et al. | 716/21 |
| 2005/0055658 A1* | 3/2005 | Mukherjee et al. | 716/19 |
| 2005/0076321 A1* | 4/2005 | Smith | 716/19 |
| 2005/0081179 A1* | 4/2005 | Melvin, III | 716/20 |
| 2005/0097501 A1* | 5/2005 | Cobb et al. | 716/21 |
| 2005/0153212 A1* | 7/2005 | Lavin et al. | 430/5 |
| 2005/0198609 A1* | 9/2005 | Hwang et al. | 716/21 |
| 2005/0216877 A1* | 9/2005 | Pack et al. | 716/19 |
| 2005/0273753 A1* | 12/2005 | Sezginer | 716/21 |
| 2005/0278685 A1* | 12/2005 | Granik et al. | 716/19 |
| 2006/0057475 A1* | 3/2006 | Liebmann et al. | 430/5 |
| 2006/0062445 A1* | 3/2006 | Verma et al. | 382/144 |
| 2006/0115753 A1* | 6/2006 | Zhang | 430/30 |
| 2006/0117292 A1* | 6/2006 | Rodin et al. | 716/19 |
| 2006/0190912 A1* | 8/2006 | Melvin et al. | 716/19 |
| 2006/0190913 A1* | 8/2006 | Melvin et al. | 716/19 |
| 2006/0206851 A1* | 9/2006 | Van Wingerden et al. | 716/19 |
| 2006/0218520 A1* | 9/2006 | Pierrat et al. | 716/19 |
| 2006/0236294 A1* | 10/2006 | Saidin et al. | 716/19 |
| 2006/0269875 A1* | 11/2006 | Granik | 430/311 |
| 2007/0014452 A1* | 1/2007 | Suresh et al. | 382/128 |
| 2007/0124708 A1* | 5/2007 | Torres Robles et al. | 716/4 |

* cited by examiner

METHOD AND APPARATUS FOR IDENTIFYING ASSIST FEATURE PLACEMENT PROBLEMS

RELATED APPLICATION

This application is a continuation-in-part of, and hereby claims priority under 35 U.S.C. § 120 to, U.S. patent application Ser. No. 11/083,656, now U.S. Pat. No. 7,243,332, entitled, "METHOD AND APPARATUS FOR IDENTIFYING A MANUFACTURING PROBLEM AREA IN A LAYOUT USING A GRADIENT-MAGNITUDE OF A PROCESS-SENSITIVITY MODEL," by inventors Lawrence S. Melvin III, James P. Shiely, and Qiliang Yan filed on 17th Mar. 2005.

BACKGROUND

1. Field of the Invention

The present invention is related to integrated circuit fabrication. More specifically, the present invention is related to a method and apparatus for identifying assist feature placement problems.

2. Related Art

Semiconductor manufacturing technologies typically include a number of processes which involve complex physical and chemical interactions. Since it is almost impossible to perfectly control these complex physical and chemical interactions, these processes typically have process variations that can cause the characteristics of the actual integrated circuit to be different from the desired characteristics. If this difference is too large, it can lead to manufacturing problems which can reduce the yield and/or reduce the performance of the integrated circuit.

Consequently, to be economically viable, a semiconductor manufacturing process has to be robust with respect to process variations, i.e., it must be able to tolerate a large enough range of process variations. (We describe the present invention in the context of "depth of focus," which usually refers to process variations in photolithography. But, it will be apparent to one skilled in the art that the present invention can be readily applied to include other manufacturing process variations, such as, dose variation, resist thickness variations, etch variations, and doping variations.)

Note that improving the depth of focus directly results in cost savings. This is because it can substantially increase the throughput by reducing the amount of time spent on inspection, servicing, and maintenance of the equipment. In addition, the actual process conditions encountered during manufacturing may vary due to a variety of reasons. For example, topographical variations on the wafer can occur due to imperfections in the chemical-mechanical polishing process step. As a result, improving the depth of focus can increase the yield for chips that are manufactured in the presence of these process variations.

Depth of focus can be improved by using assist features. Note that assist features can be printing (e.g., super-resolution assist features) or non-printing (e.g., sub-resolution assist features). In either case, assist features are meant to improve the depth of focus of the patterns on the mask layout intended to be printed on the wafer.

Unfortunately, using assist features to improve depth of focus can be very challenging, especially at deep submicron dimensions. Process engineers typically create sophisticated rule tables that specify the shape and placement of assist features from empirical wafer data. Unfortunately, assist feature rule tables can result in missed or sub-optimal placement of assist features. Furthermore, at deep submicron dimensions, assist feature rule tables can be extremely large and unwieldy. Moreover, assist feature rule tables can be overly restrictive which can prevent designers from being able to achieve the best device performance.

Hence, what is needed is a method and an apparatus to identify assist feature placement problems so that they can be corrected, thereby improving the manufacturability of the mask layout.

SUMMARY

One embodiment of the present invention provides a system that identifies an area in a mask layout which is likely to cause manufacturing problems due to a missing or an improperly placed assist feature. During operation, the system receives an uncorrected or corrected mask layout. The system then dissects the mask layout into segments. Next, the system identifies a problem area associated with a segment using a process-sensitivity model which can be represented by a multidimensional function that captures process-sensitivity information. Note that identifying the problem area allows a new assist feature to be added or an existing assist feature to be adjusted, thereby improving the wafer manufacturability. Moreover, using the process-sensitivity model reduces the computational time required to identify the problem area.

In a variation on this embodiment, the system computes the process-sensitivity model by: creating an on-target process model that models a semiconductor manufacturing process under nominal process conditions; creating one or more off-target process models that model the semiconductor manufacturing process under one or more process conditions that are different from nominal process conditions; and computing the process-sensitivity model using the on-target process model and the one or more off-target process models. Specifically, the system can compute the process-sensitivity model by computing a linear combination of the on-target process model and the one or more off-target process models. Furthermore, the semiconductor manufacturing process can include: photolithography, etch, chemical-mechanical polishing (CMP), trench fill, or reticle manufacture.

In a variation on this embodiment, the system identifies the problem area associated with the segment by first computing a problem-indicator by convolving the process-sensitivity model with a multidimensional function that represents the mask layout. Next, the system compares the value of the problem-indicator with a threshold to identify the problem area associated with the segment.

In a further variation on this embodiment, the system determines the threshold by first determining a segment-type of the segment based on the feature geometry in the proximity of the segment. The system then selects the threshold based on the segment-type. Note that using an appropriate threshold that is based on the segment-type allows the method to accurately determine the type and the severity of the problem area.

In a variation on this embodiment, the system identifies the problem area associated with the segment by first computing a gradient-magnitude of the process-sensitivity model. The system then computes a problem-indicator by convolving the gradient-magnitude of the process-sensitivity model with a multidimensional function that represents the mask layout. Next, the system compares the value of the problem-indicator with a threshold to identify the problem area associated with the segment.

DETAILED DESCRIPTION

Integrated Circuit Design and Fabrication

Figure 1:
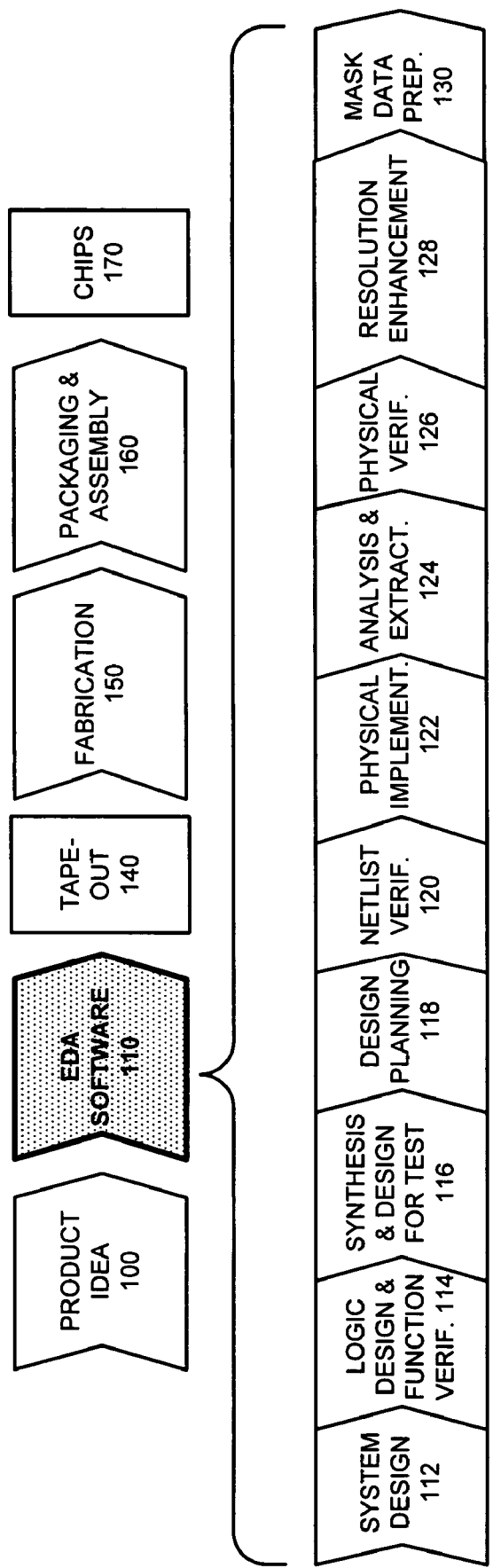
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

The present invention can be used during one or more of the above described steps. Specifically, the SiVL® or the AFGen® product from Synopsys, Inc. can be suitably modified to use the present invention to identify problem areas in a mask layout.

Process Variations

Semiconductor manufacturing technologies typically include a number of processes which involve complex physical and chemical interactions. Since it is almost impossible to perfectly control these complex physical and chemical interactions, these processes typically have process variations that can cause the characteristics of the actual integrated circuit to be different from the desired characteristics. If this difference is too large, it can lead to manufacturing problems which can reduce the yield and/or reduce the performance of the integrated circuit.

Process variations can arise due to a variety of reasons. For example, in photolithography, variations in the rotation speed of the spindle can cause the resist thickness to vary, which can cause variations in the reflectivity, which, in turn, can cause unwanted changes to the pattern's image. Similarly, bake plates—which are used to drive the solvents out of the wafer and form the pattern in photoresist—can have hot or cold spots, which can cause variations in the critical dimension (CD). Likewise, the chuck that holds the wafer during photo exposure can contain microparticles which create "hills" on the wafer's surface that can cause defocusing during lithography. Note that defocusing can also occur because the chuck is out of level, or the lens has aberrations, or the wafer is not completely flat, amongst other reasons.

It is helpful to classify process variations into two types: random and systematic. (Note that the term "depth of focus" is often used as a catch-all term to describe the amount of process margin available to compensate for random process variations.) Random process variations are those process variations that are not presently being modeled using an analytical model. On the other hand, systematic process variations are those process variations that are typically modeled using analytical models. For example, spindle speed variation is typically classified as a random process variation, while pattern corner rounding has been compensated for in a systematic manner. Note that, researchers are continually trying to convert random process variations into systematic process variations by creating new analytical models that model random process variations. Once a random process variation is understood to become a systematic process variation, the systematic variation can generally be compensated for during OPC.

Manufacturing Problems

To be economically viable, a semiconductor manufacturing process has to be robust with respect to process variations, i.e., it must be able to tolerate a large enough range of process variations. Note that, improving the robustness (or depth of focus) of a process directly results in cost savings. This is because improving depth of focus reduces the amount of time spent on inspection, servicing, and maintenance of the equipment, thereby increasing the number of wafers that are run. Furthermore, improving the depth of focus can increase the yield. Due to these reasons, increasing depth of focus can substantially increase profits.

Moreover, the importance of improving depth of focus increases as a manufacturing process shifts to smaller dimensions because the inherent depth of focus in these processes becomes rapidly smaller. Specifically, at deep submicron dimensions, even a small improvement in the depth of focus can save millions of dollars in manufacturing costs.

Assist Features

Assist features are often used for improving depth of focus during semiconductor manufacturing. In particular, sub-resolution assist features (SRAFs) have been especially effective when applied to gate structures and other one-dimensional features. (For the sake of clarity, the present invention has been described in the context of sub-resolution assist features. But, it will be apparent to one skilled in the art that the present invention can be readily applied to other kinds of assist features, such as super-resolution assist features. In the remainder of the instant application, unless otherwise stated, the term "assist feature" will refer to a sub-resolution assist feature.)

Figure 2:
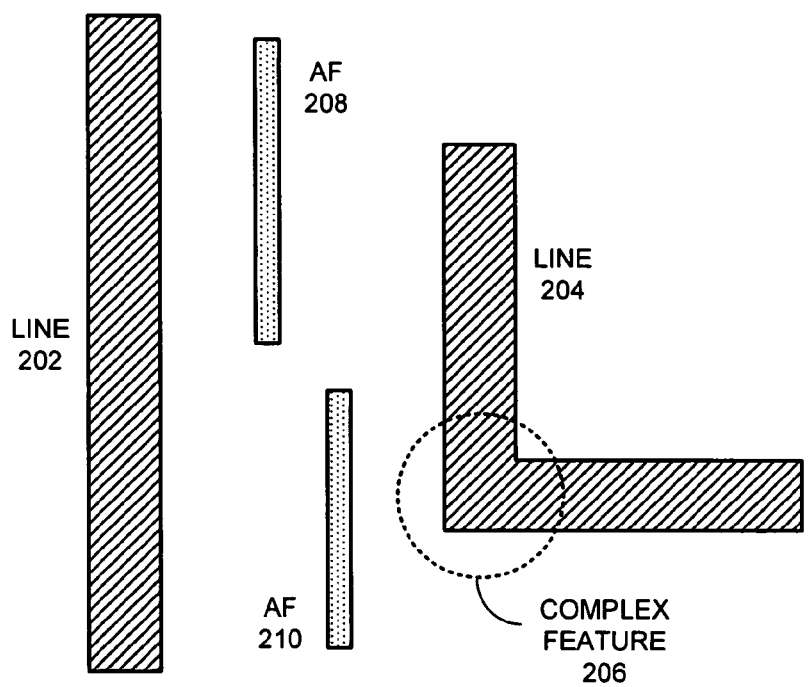
FIG. 2 illustrates assist feature placement in a mask layout in accordance with an embodiment of the present invention.

FIG. 2 illustrates assist feature placement in a mask layout in accordance with an embodiment of the present invention.

Lines 202 and 204 are part of a mask layout. Note that line 204 contains complex feature 206. Assist feature placement is more challenging when a layout contains complex features. For example, due to the complex feature 206, we may need to place two assist features 208 and 210 that are staggered, instead of just one assist feature. A layout that has multiple lines with varying pitches is another example of a complex layout.

Present methods for placing assist features use a rule-based methodology where the assist feature placement is dictated by combinations of feature width and spacing parameters.

Figure 3:
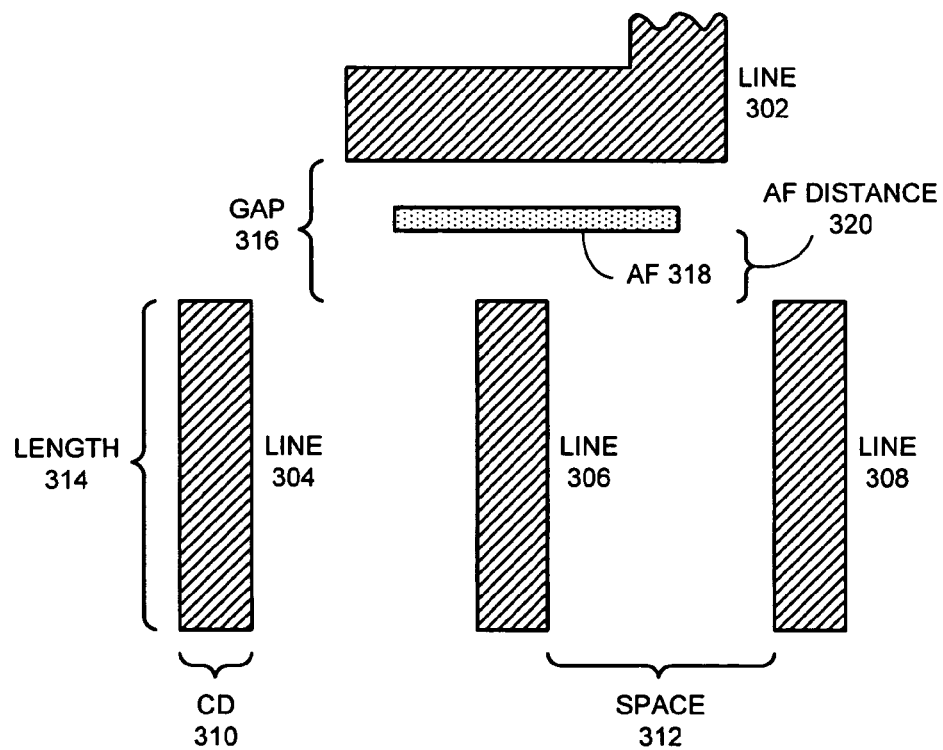
FIG. 3 illustrates assist feature placement using a rule-based methodology in accordance with an embodiment of the present invention.

FIG. 3 illustrates assist feature placement using a rule-based methodology in accordance with an embodiment of the present invention.

Lines 302, 304, 306, and 308 are part of a mask layout. In a rule-based approach, assist feature (AF) 318 placement can depend on a variety of factors which are organized in the form of a rule table. For example, the AF distance 320 can be a determined based on a rule table that includes a variety of factors, such as, the critical dimension (CD) 310, space 312, length 314, and gap 316.

Unfortunately, design rule tables can result in missed or sub-optimal placement of assist features. Furthermore, for large and complex layouts the rule table can become extremely large and unwieldy. Moreover, design rule tables can be overly restrictive which can prevent designers from being able to achieve the best device performance.

Identifying Assist Feature Placement Problems

One of the primary goals of semiconductor manufacturing is to, in one measurement, get all the process variation information at a point on a mask layout. If we achieve this, we can identify and correct manufacturing problem areas due to missing or incorrectly placed assist features, thereby improving the manufacturability of the mask layout. For example, if we know that a line-end is highly sensitive to process variations and is likely to pull back 40 nm during manufacturing, the designer can use this information to add or adjust an assist feature to fix the manufacturing problem.

Furthermore, it is very important that we identify these problem areas without using a substantial amount of computation time. Note that problem areas can be identified by simulating various process conditions and by comparing the resulting patterns to determine areas that can cause manufacturability problems. Unfortunately, this approach can require a substantial amount of computational time because it involves running multiple complex simulation models.

Instead, what is needed is a process that can quickly tell us whether an assist feature is going to improve the stability of a structure within a workable process window. (Note that determining whether a structure is stable or not depends on the type of the layer. For example, in a metal layer, significant CD variations may be acceptable as long as they do not cause a short or an open in the circuit. In contrast, in a polysilicon layer, even very small CD variations may be unacceptable.)

One embodiment of the present invention provides a system for identifying an area in a mask layout which is likely to cause manufacturing problems due to missing or improperly placed assist features. Specifically, in one embodiment of the present invention, the system uses a gradient-magnitude of a "process-sensitivity model" (which can be represented using a multidimensional function that captures process-sensitivity information) to query a pattern and generate a problem indicator that indicates the amount of process variation that is expected to occur at any point on mask layout. Based on the amount of process variation, a designer can decide whether it is likely to cause problems during manufacturing and take appropriate counter measures, such as adding or adjusting an assist feature.

Furthermore, in one embodiment of the present invention, the system uses the computed problem indicator to generate a contour. Specifically, the contour can be used to indicate the type and severity of the assist feature placement problem. Note that generating a contour can be very useful because it interprets the process variation data and visually identifies the problem areas to the user. Moreover the contour can be displayed using a standard optical intensity viewing tool, such as the ICWorkbench™ tool from Synopsys.

Note that a key advantage is that the process can capture process-sensitivity information in a single multidimensional function. (Note that, to improve computational efficiency, a multidimensional function is often represented using a linear combination of a set of orthogonal functions, which are typically called basis functions. But, from a mathematical standpoint, the process-sensitivity model can still be viewed as a single multidimensional function.) Furthermore, this allows the system to directly identify the problem area. Specifically, the system can quickly compute a problem-indicator by simply convolving the gradient-magnitude of the process-sensitivity model with another multidimensional function that represents the mask layout. The system can then compare the problem-indicator with a threshold to identify a manufacturing problem area, thereby substantially reducing the amount of computational time required to identify the manufacturing problem area.

Using a Process-Sensitivity model to Identify Assist Feature Placement Problems

Figure 4:
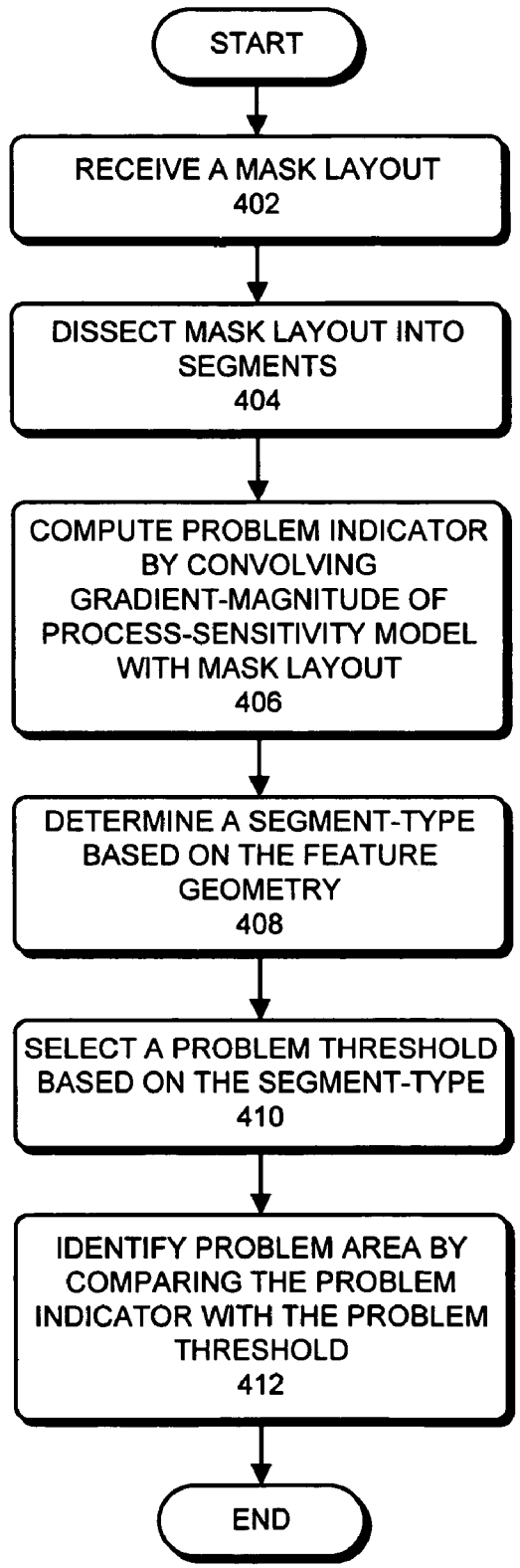
FIG. 4 presents a flowchart that illustrates a process for identifying a problem area in accordance with an embodiment of the present invention.

FIG. 4 presents a flowchart that illustrates a process for identifying a problem area in accordance with an embodiment of the present invention.

The process typically begins by receiving a mask layout which can contain assist features (step 402).

The system then dissects the mask layout into a number of segments (step 404). Note that a segment can be any arbitrary portion of a polygon edge.

Next, the system identifies a problem area associated with a segment using a process-sensitivity model which can be represented by a multidimensional function that captures process-sensitivity information. Specifically, in one embodiment, the system identifies a problem area associated with a segment using a gradient-magnitude of the process-sensitivity model.

Note that, the system can compute the process-sensitivity model by first creating an on-target process model that models a semiconductor manufacturing process under nominal process conditions. Furthermore, note that the semiconductor processing technology can include photolithography, etch, chemical-mechanical polishing (CMP), trench fill, and/or other technologies and combinations of the foregoing.

Next, the system can create one or more off-target process models that model the semiconductor manufacturing process under one or more process conditions that are different from nominal process conditions.

Specifically, an on-target (or off-target) process model can be represented by a multidimensional function. Moreover, an on-target (or off-target) process model can be represented using a set of basis functions. Furthermore, in one embodiment, creating an on-target process model involves fitting an analytical model to process data for the semiconductor manufacturing process under nominal process conditions. Likewise, creating the one or more off-target process models can involve fitting an analytical model to process data for the semiconductor manufacturing process under process conditions that are different from nominal process conditions. Additionally, in one embodiment, the one or more off-target process models can be created by analytically perturbing the on-target process model.

Figure 5A:
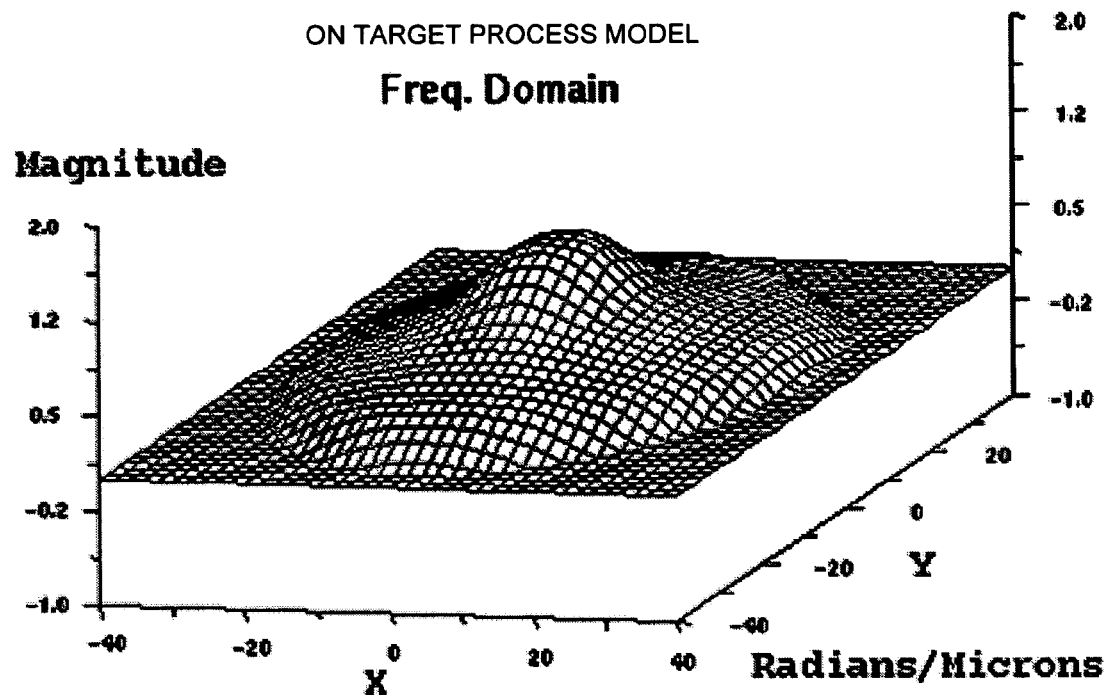
FIG. 5A illustrates a plot of a 2-D function that represents an on-target process model in accordance with an embodiment of the present invention.

FIG. 5A illustrates a plot of a 2-D function that represents an on-target process model in accordance with an embodiment of the present invention.

Figure 5B:
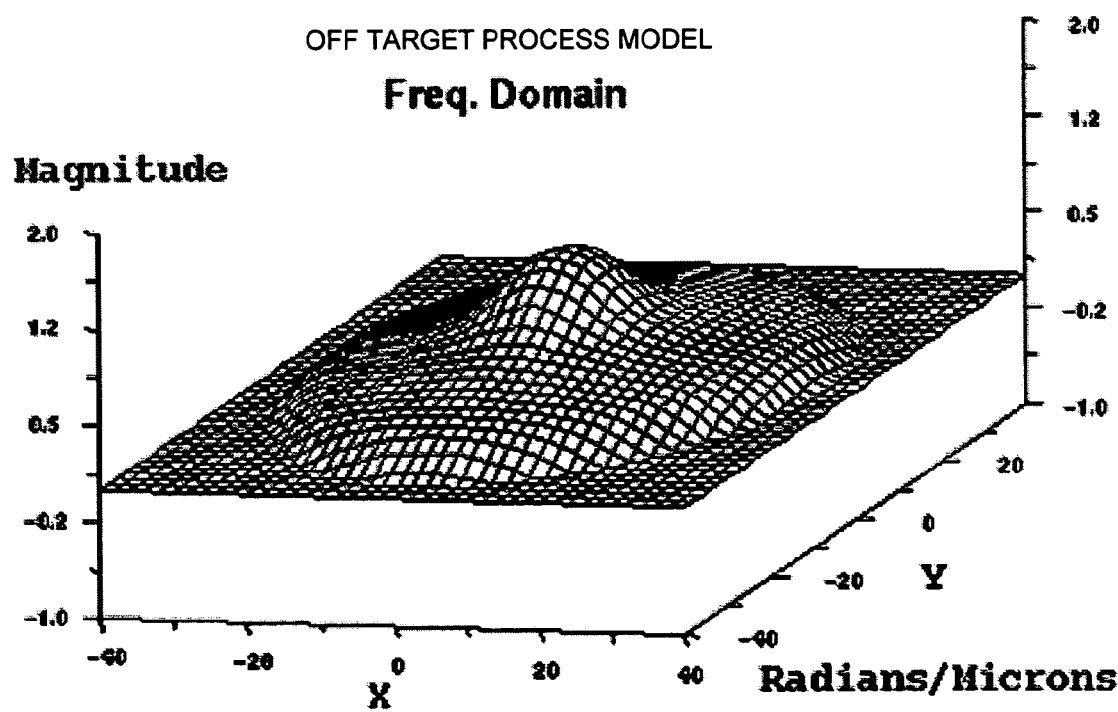
FIG. 5B illustrates a plot of a 2-D function that represents an off-target process model in accordance with an embodiment of the present invention.

FIG. 5B illustrates a plot of a 2-D function that represents an off-target process model in accordance with an embodiment of the present invention.

Figure 5C:
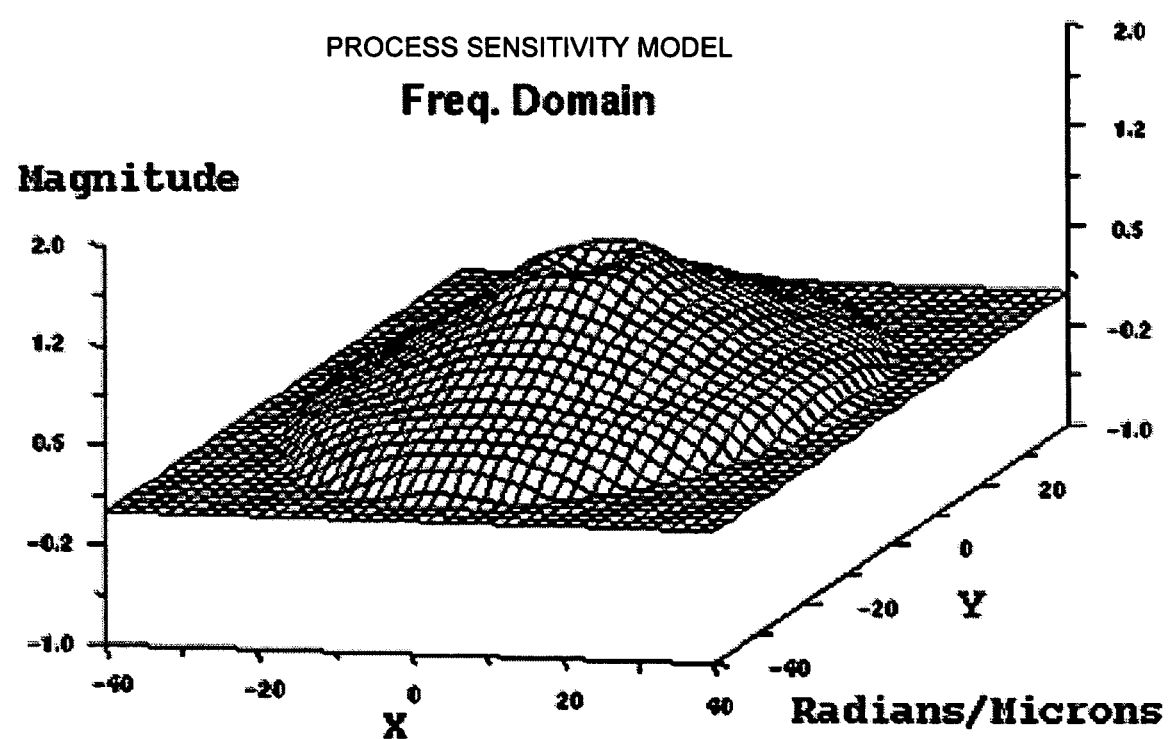
FIG. 5C illustrates a plot of a process-sensitivity model in accordance with an embodiment of the present invention.

FIG. 5C illustrates a plot of a process-sensitivity model in accordance with an embodiment of the present invention.

Note that the 2-D functions illustrated in FIG. 5A and FIG. 5B represent the on-target and the off-target process models, respectively, in the spatial frequency domain. Furthermore, in FIG. 5A, FIG. 5B, and FIG. 5C, the X and Y axes identify a spatial-frequency component (in units of radians per micron), whereas the Z axis indicates the magnitude of a specific spatial-frequency component. These process models can also be represented in other domains, such as the space domain. Additionally, these process models can also be represented in other coordinates, such as polar coordinates.

In one embodiment, the system computes the process-sensitivity model by computing a linear combination of the on-target process model and the one or more off-target process models. Note that the process-sensitivity model models the pattern features that are lost during defocus.

Specifically, consider the optical lithography case. Let $P_t$ represent an on-target process model, i.e., let $P_t$ model the optical lithography process when it is in focus. Furthermore, let $P_d$ represent an off-target process model, e.g., let $P_d$ model the optical lithography process when it is defocused. Now, the process-sensitivity model, $F_p$, can be computed as follows:

$$F_p = (P_t - P_d)/\Delta P_d,$$

where $\Delta P_d$ is the focus offset (in units of length).

Note that in the above example, we only considered a single off-target process model. But, we can have two or more off-target process models. In general, the process-sensitivity model, $F_p$, can be computed as follows:

$$F_p = \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right),$$

where $P_1 \ldots _n$ are off-target process models that model arbitrary (e.g., non-optimal) process conditions, $P_t$ is the on-target process model that models a nominal (e.g., optimal) process condition, and $\Delta P_1 \ldots _n$ are the respective changes in the process conditions between the nominal process condition and the arbitrary (1 . . . n) process conditions.

For example, let $P_t$ model the optical lithography process when it is in focus. Furthermore, let $P_{dn}$ model the optical lithography process when it is negatively defocused, i.e., the distance between the lens and the wafer is less than the on-target distance. Additionally, let $P_{dp}$ model the optical lithography process when it is positively defocused, i.e., the distance between the lens and the wafer is larger than the on-target distance. Now, the process-sensitivity model, $F_p$, can be computed as follows:

$$F_p = \frac{1}{2}\left(\frac{(P_0 - P_{dn})}{\Delta P_{dn}} + \frac{(P_0 - P_{dn})}{\Delta P_{dp}}\right),$$

where $\Delta P_{dn}$ and $\Delta P_{dp}$ are the negative and positive focus offsets (in units of length).

Note that, $(P_t - P_{dn})/\Delta P_{dn}$ and $(P_t - P_{dp})/\Delta P_{dp}$ model the pattern features that are lost during negative and positive defocusing, respectively. In the above example, we compute the process-sensitivity model, $F_p$, by adding $(P_t - P_{dn})/\Delta P_{dn}$ and $(P_t - P_{dp})/\Delta P_{dp}$, and by dividing by 2 to normalize the process-sensitivity model. (Note that normalization is not necessary for the invention to work.)

In one embodiment, the system then computes a gradient-magnitude of the process-sensitivity model. Note that the term "gradient-magnitude" can broadly refer to a rate of change of the process-sensitivity model. Furthermore, it will also be apparent that the gradient-magnitude for the process-sensitivity model can be computed using a variety of mathematical formulae. Specifically, in one embodiment of the present invention, the system computes the gradient-magnitude of the process-sensitivity model, $G_p$, as follows:

$$G_p = \left|\nabla \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right)\right|,$$

where $P_1 \ldots _n$ are off-target process models that model arbitrary (e.g., non-optimal) process conditions, $P_t$ is the on-target process model that models a nominal (e.g., optimal) process condition, and $\Delta P_1 \ldots _n$ are the respective changes in the process conditions between the nominal process condition and the arbitrary (1 . . . n) process conditions.

Continuing with the flowchart of FIG. 4, the system computes a problem-indicator by convolving the gradient-magnitude of the process-sensitivity model with a multidimensional function that represents the mask layout (step 406). In one embodiment, the system computes the problem-indicator at an evaluation point in the proximity of a segment. Moreover, the system can store the value of the problem-indicator in a database so that the value of the problem-indicator at a location in the mask layout can be found by querying the database.

In another embodiment, the system can compute the problem-indicator by convolving the process-sensitivity model with a multidimensional function that represents the mask layout.

In yet another embodiment, the problem-indicator can be computed at an evaluation point by first integrating the aerial-image intensity over an area around the evaluation point. The system can then compute the problem-indicator by taking the partial derivative of the integral with respect to the defocus offset.

Figure 6:
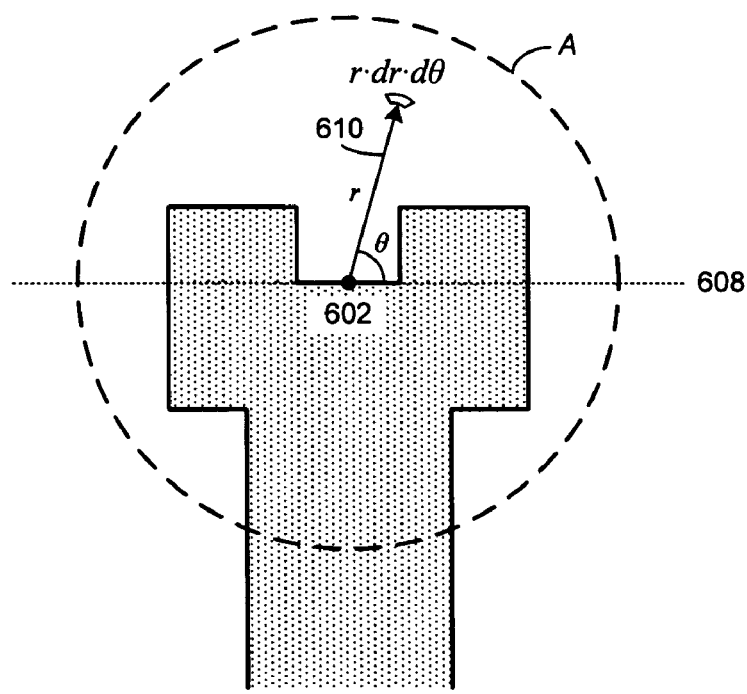
FIG. 6 illustrates how the problem-indicator can be computed by integrating the aerial-image intensity in accordance with an embodiment of the present invention.

FIG. 6 illustrates how the problem-indicator can be computed by integrating the aerial-image intensity in accordance with one embodiment of the present invention.

Let I(r,θ) represent the aerial-image intensity in polar coordinates, where r is the radial distance between evaluation point 602 and elemental area r·dr·dθ, and θ is the angle between reference line 608 and line 610 which passes through evaluation point 602 and elemental area r·dr·dθ.

The system can compute the surface integral, P, of the aerial-image over area A as follows:

$$P = \int\int_A I(r, \theta) \cdot r \cdot dr \cdot d\theta.$$

Next, the system can compute the problem-indicator at the evaluation point by computing the partial derivative of P with respect to the defocus offset.

Continuing with the flowchart in FIG. 4, the system then compares the value of the problem-indicator with a threshold to identify a problem area associated with the segment. Specifically, in one embodiment, the system determines a segment-type of the segment based on the feature geometry in the proximity of the segment (step 408).

Figure 7A:
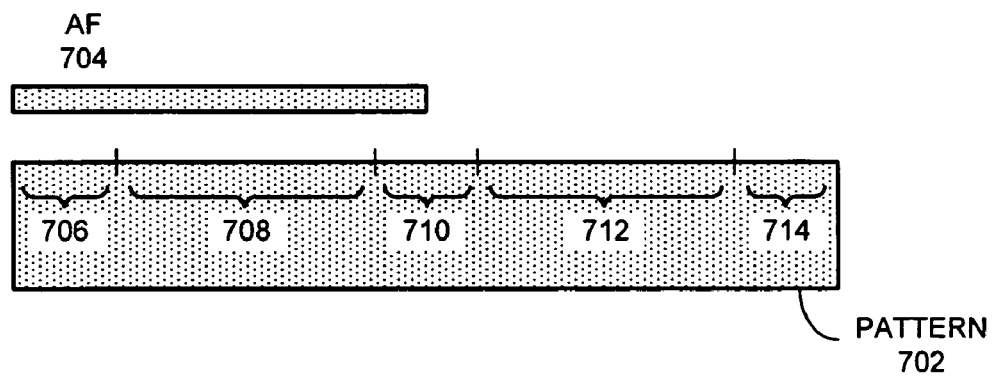
FIG. 7A illustrates how a segment-type can be determined based on the feature geometry in the proximity of a segment in accordance with one embodiment of the present invention.

FIG. 7A illustrates how a segment-type can be determined based on the feature geometry in the proximity of a segment in accordance with one embodiment of the present invention.

Pattern 702 can be dissected into segments 706, 708, 710, 712, and 714. (Note that, usually each edge of a pattern is dissected into one or more segments. But, in FIG. 7A, for the sake of clarity, we only dissect one edge of pattern 702.)

Note that the system can dissect a mask layout into segments based on how features (or patterns) are positioned relative to one another. For example, in the absence of assist feature (AF) 704, the system could have dissected pattern 702 into only three segments: 706, 714, and a single segment that combines 708, 710, and 712.

The system can then determine a segment-type for a segment based on the feature geometry in the proximity of the segment. For example, segments 706 and 714 can be classified as 2-D region segments, segments 708 and 712 can be classified as 1-D run segments, and segment 710 can be classified as an AF transition segment.

Note that the term "feature geometry" can refer to the shape and size of one or more features associated with a segment as well as the position of the segment relative to other features or patterns in the mask layout.

Note that the segment-types disclosed in the present application are not intended to be exhaustive or to limit the present invention. Accordingly, many variations of feature geometries and associated segment-types will be readily apparent.

Figure 7B:
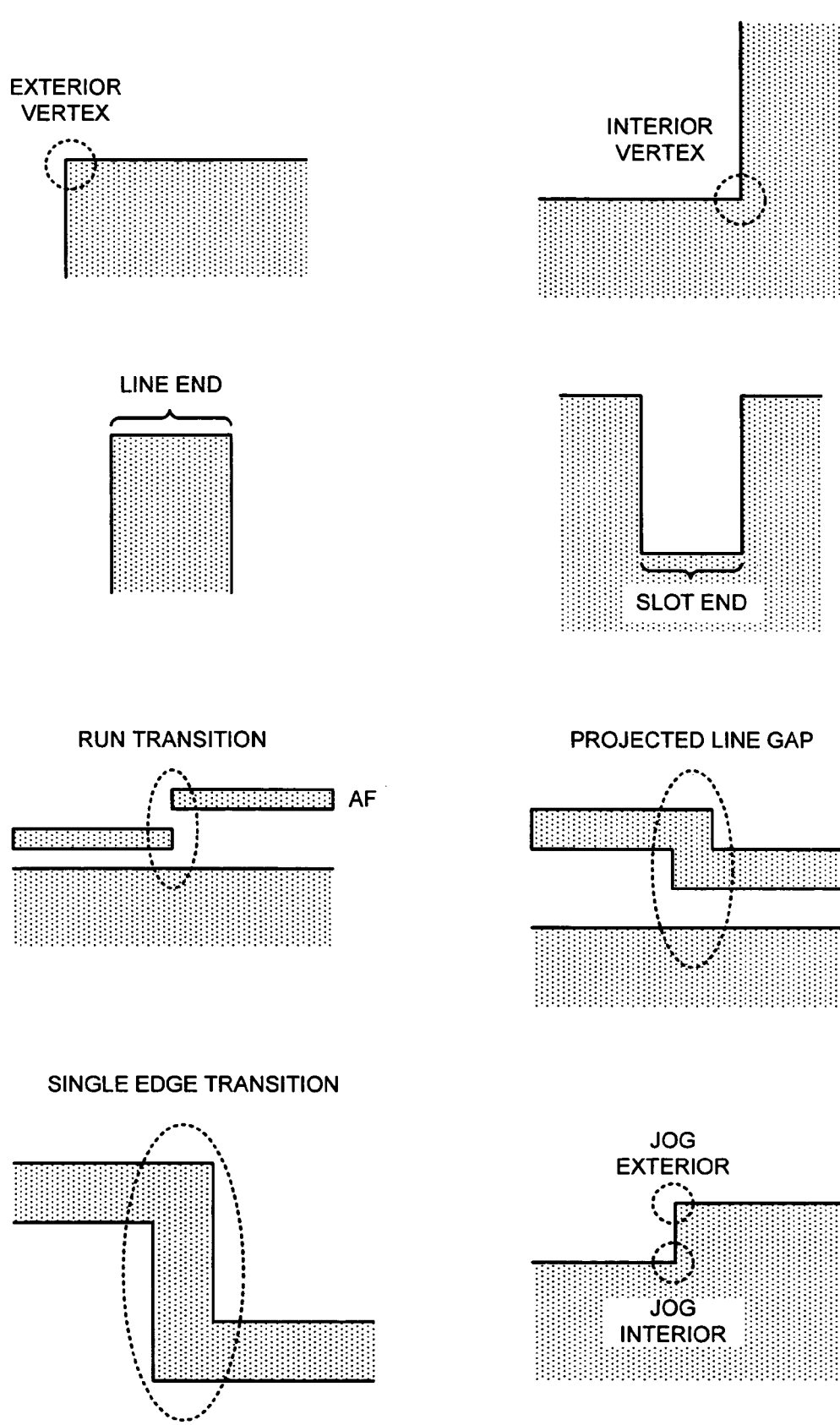
FIG. 7B illustrates a variety of feature geometries that can be used to determine a segment-type in accordance with an embodiment of the present invention.

Specifically, FIG. 7B illustrates a variety of feature geometries that can be used to determine a segment-type in accordance with an embodiment of the present invention.

Continuing with the flowchart of FIG. 4, the system selects the problem threshold based on the segment-type (step 410). Note that using an appropriate threshold that is based on the segment-type allows the method to accurately determine the type and the severity of the problem area.

The system then identifies the problem area by comparing the problem-indicator with the problem threshold (step 412).

Figure 8A:
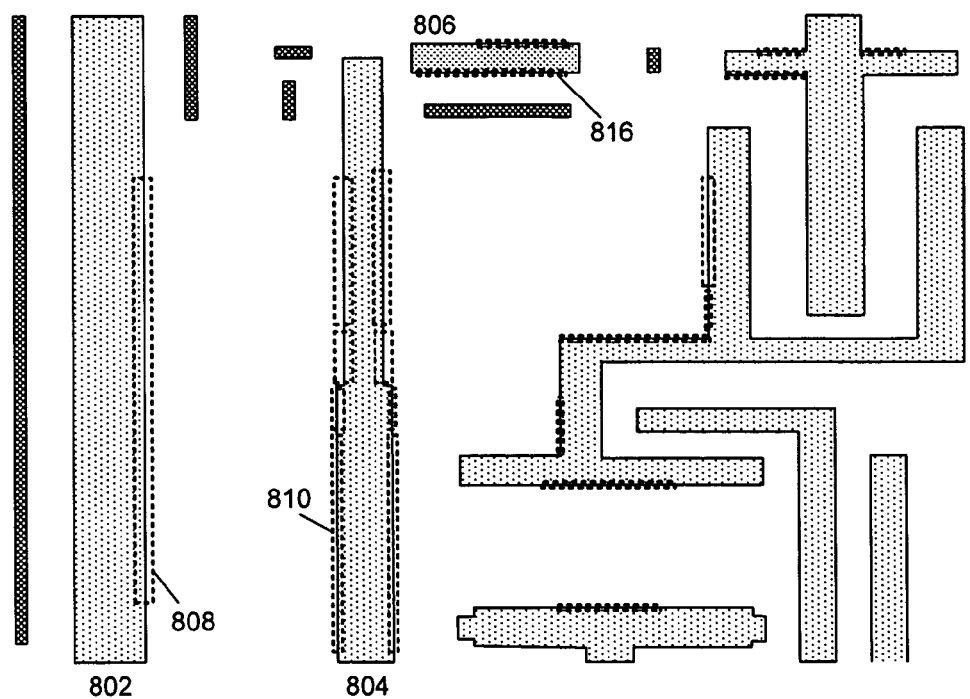
FIG. 8A and FIG. 8B illustrate how a gradient-magnitude of a process-sensitivity model can be used to identify an area in a mask layout which is likely to cause manufacturing problems due to missing or improperly placed assist features in accordance with an embodiment of the present invention.
Figure 8B:
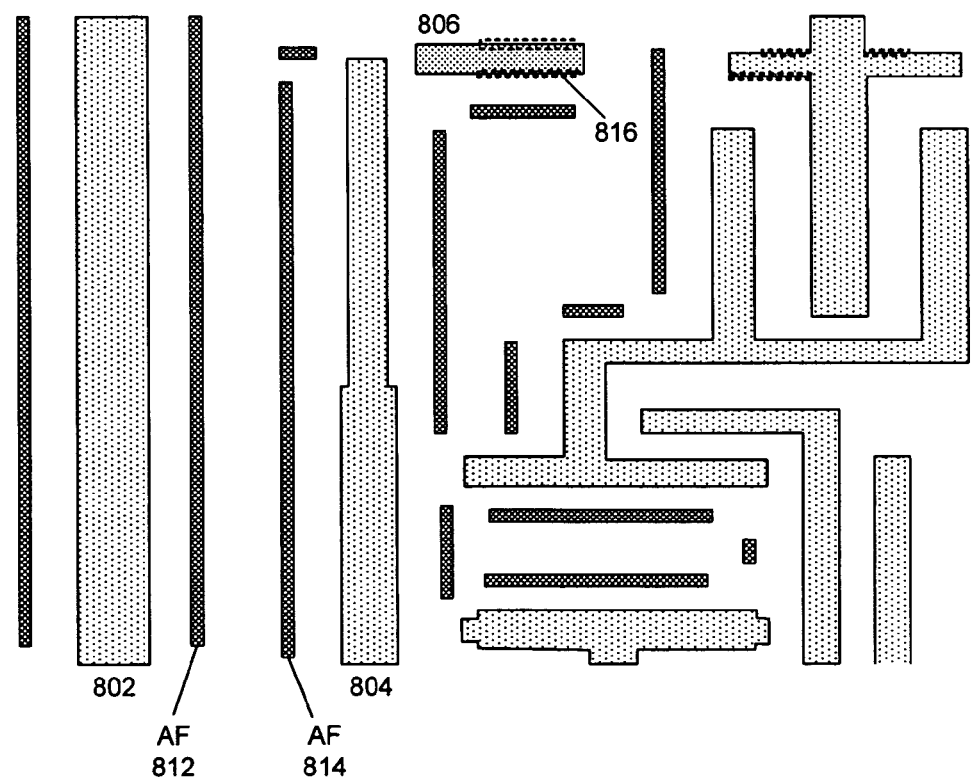

FIG. 8A and FIG. 8B illustrate how a gradient-magnitude of a process-sensitivity model can be used to identify an area in a mask layout which is likely to cause manufacturing problems due to missing or improperly placed assist features in accordance with an embodiment of the present invention.

The mask layout shown in FIG. 8A includes a number of uncorrected patterns, such as patterns 802, 804, and 806. (Note that embodiments of the present invention can be used to identify manufacturing problem areas in an uncorrected, partially corrected, or completely corrected mask layout.)

The system can use a gradient-magnitude of a process-sensitivity model to identify manufacturing problem areas, such as, problem areas 808, 810, and 816, which are caused by missing or improperly placed assist features.

Note that a process engineer can use this information to add or adjust assist features, thereby improving the manufacturability of the mask layout.

Specifically, FIG. 8B illustrates the mask layout after adding and adjusting assist features at various locations. For example, newly added assist features 812 and 814 correct problem areas 808 and 810, respectively.

Note that, adding and adjusting various assist features to the mask layout shown in FIG. 8A did not correct problem area 816. Hence, a designer may need to add or adjust assist features in the proximity of problem area 816 to correct the problem to improve the manufacturability of the layout.

In one embodiment, the system can display these problem areas using a standard optical intensity viewing tool. Note that the system can use a number of visual cues to indicate the type and severity of the manufacturing problem. For example, the system can use a specific color to indicate the type of the manufacturing problem. Moreover, the system can use the width of the marker that specifies the location of the problem area to indicate the severity of the manufacturing problem.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for identifying an area in an uncorrected or corrected mask layout which is likely to cause manufacturing problems due to a missing or an improperly placed assist feature, the method comprising:

receiving a mask layout;

dissecting the mask layout into segments;

computing a problem-indicator for a segment by convolving one of a process sensitivity model or a gradient-magnitude of the process-sensitivity model with a multidimensional function that represents the mask layout; and comparing a value of the problem-indicator with a threshold to identify a problem area associated with the segment;

wherein identifying the problem area allows a new assist feature to be added or an existing assist feature to be adjusted, thereby improving a wafer manufacturability of the mask layout;

wherein using the process-sensitivity model reduces a computational time required to identify the problem area.

2. The method of claim 1, wherein the method further comprises computing the process-sensitivity model by:

creating an on-target process model that models a semiconductor manufacturing process under nominal process conditions;

creating one or more off target process models that model the semiconductor manufacturing process under one or more process conditions that are different from nominal process conditions; and computing the process-sensitivity model using the on-target process model and one or more off target process models.

3. The method of claim 2, wherein computing the process-sensitivity model involves computing a linear combination of the on-target process model and the one or more off target process models.

4. The method of claim 1, wherein the method further comprises determining the threshold by:

determining a segment-type of the segment based on a feature geometry proximal to the segment; and selecting the threshold based on the segment-type, wherein using an appropriate threshold based on the segment-type allows the method to accurately determine a type and a severity of the problem area.

5. The method of claim 1, wherein a semiconductor manufacturing process used during wafer manufacturing includes at least one of:

photolithography;
etch;
chemical-mechanical polishing (CMP);
trench fill; or
reticle manufacture.

6. A method for identifying an area in an uncorrected or corrected mask layout which is likely to cause manufacturing problems due to a missing or an improperly placed assist feature, the method comprising:

receiving a mask layout;
dissecting the mask layout into segments;
computing an integral of an aerial-image intensity function over a surface proximal to a segment;
computing a partial derivative of the integral of the aerial-image intensity function; and
comparing a value of the partial derivative with a threshold to identify a problem area associated with the segment;

wherein identifying the problem area allows a new assist feature to be added or an existing assist feature to be adjusted, thereby improving a wafer manufacturability of the mask layout;

wherein using the aerial-image intensity function reduces a computational time required to identify the problem area.

7. The method of claim 6, wherein the method further comprises determining the threshold by:

determining a segment-type of the segment based on a feature geometry proximal to the segment; and selecting the threshold based on the segment-type, wherein using an appropriate threshold based on the segment-type allows the method to accurately determine a type and a severity of the problem area.

8. The method of claim 6, wherein a semiconductor manufacturing process used during wafer manufacturing includes at least one of:

photolithography;
etch;
chemical-mechanical polishing (CMP);
trench fill; or
reticle manufacture.

9. A computer-readable storage medium storing instructions that when executed by a computer cause the computer to perform a method for identifying an area in an uncorrected or corrected mask layout which is likely to cause manufacturing problems due to a missing or an improperly placed assist feature, the method comprising:

receiving a mask layout;
dissecting the mask layout into segments;
computing a problem-indicator for a segment by convolving one of a process sensitivity model or a gradient-magnitude of the process-sensitivity model with a multidimensional function that represents the mask layout; and comparing a value of the problem-indicator with a threshold to identify a problem area associated with the segment;

wherein identifying the problem area allows a new assist feature to be added or an existing assist feature to be adjusted, thereby improving a wafer manufacturability of the mask layout;

wherein using the process-sensitivity model reduces a computational time required to identify the problem area.

10. The computer-readable storage medium of claim 9, wherein the method further comprises computing the process-sensitivity model by:

creating an on-target process model that models a semiconductor manufacturing process under nominal process conditions;

creating one or more off-target process models that model the semiconductor manufacturing process under one or more process conditions that are different from nominal process conditions; and computing the process-sensitivity model using the on-target process model and the one or more off-target process models.

11. The computer-readable storage medium of claim 10, wherein computing the process-sensitivity model involves computing a linear combination of the on-target process model and the one or more off-target process models.

12. The computer-readable storage medium of claim 9, wherein the method further comprises determining the threshold by:

determining a segment-type of the segment based on a feature geometry proximal to the segment; and selecting the threshold based on the segment-type, wherein using an appropriate threshold based on the segment-type allows the method to accurately determine a type and a severity of the problem area.

13. The computer-readable storage medium of claim 9, wherein a semiconductor manufacturing process used during wafer manufacturing includes at least one of:

photolithography;
etch;
chemical-mechanical polishing (CMP);
trench fill; or
reticle manufacture.

14. A computer-readable storage medium storing instructions that when executed by a computer cause the computer to perform a method for identifying an area in an uncorrected or corrected mask layout which is likely to cause manufacturing problems due to a missing or an improperly placed assist feature, the method comprising:
   receiving a mask layout;
   dissecting the mask layout into segments;
   computing an integral of an aerial-image intensity function over a surface area proximal to a segment;
   computing a partial derivative of the integral of the aerial-image intensity function; and
   comparing a value of the partial derivative with a threshold to identify a problem area associated with the segment;
   wherein identifying the problem area allows a new assist feature to be added or an existing assist feature to be adjusted, thereby improving a wafer manufacturability of the mask layout;
   wherein using the aerial-image intensity function reduces a computationa time required to identify the problem area.

15. The computer-readable storage medium of claim 14, wherein the method further comprises determining the threshold by:
   determining a segment-type of the segment based on a feature geometry proximal to the segment; and
   selecting the threshold based on the segment-type, wherein using an appropriate threshold based on the segment-type allows the method to accurately determine a type and a severity of the problem area.

16. The computer-readable storage medium of claim 14, wherein a semiconductor manufacturing process used during wafer manufacturing includes at least one of:
   photolithography;
   etch;
   chemical-mechanical polishing (CMP);
   trench fill; or
   reticle manufacture.

17. An apparatus for identifying an area in an uncorrected or corrected mask layout which is likely to cause manufacturing problems due to a missing or an improperly placed assist feature, the apparatus comprising:
   a receiving mechanism configured to receive a mask layout;
   a dissecting mechanism configured to dissect the mask layout into segments; and
   an identifying mechanism configured to:
      determine a segment-type of a segment based on a feature geometry proximal to the segment;
      select a threshold based on the segment-type; and
      compute a problem-indicator by convolving one of a gradient-magnitude of a process-sensitivity model or the process sensitivity model with a multidimensional function that represents the mask layout;
      compare a value of the problem-indicator with the threshold to identify a problem area associated with the segment;
   wherein identifying the problem area allows a new assist feature to be added or an existing assist feature to be adjusted, thereby improving a wafer manufacturability of the mask layout;
   wherein using the process-sensitivity model reduces a computational time required to identify the problem area.

18. The apparatus of claim 17, further comprising a process-sensitivity model generation mechanism configured to:
   create an on-target process model that models a semiconductor manufacturing process under nominal process conditions;
   create one or more off-target process models that model the semiconductor manufacturing process under one or more process conditions that are different from nominal process conditions; and
   compute the process-sensitivity model using the on-target process model and the one or more off-target process models.

19. The apparatus of claim 18, wherein when computing the process-sensitivity model, the process-sensitivity model generation mechanism is configured to compute a linear combination of the on-target process model and the one or more off-target process models.

20. An apparatus for identifying an area in an uncorrected or corrected mask layout which is likely to cause manufacturing problems due to a missing or an improperly placed assist feature, the apparatus comprising:
   a receiving mechanism configured to receive a mask layout;
   a dissecting mechanism configured to dissect the mask layout into segments; and
   an identifying mechanism configured to:
      determine a segment-type of a segment based on a feature geometry proximal to the segment;
      select a threshold based on the segment-type; and
      compute an integral of an aerial-image intensity function over a surface area proximal to the segment;
      compute a partial derivative of the integral of the aerial-image intensity function; and
      compare a value of the partial derivative with the threshold to identify a problem area associated with the segment;
   wherein identifying the problem area allows a new assist feature to be added or an existing assist feature to be adjusted, thereby improving a wafer manufacturability of the mask layout;
   wherein using the aerial-image intensity function reduces a computational time required to identify the problem area.

* * * * *

UNITED STATES PATENT AND TRADEMARK OFFICE
CERTIFICATE OF CORRECTION

PATENT NO. : 7,315,999 B2 Page 1 of 1
APPLICATION NO. : 11/109533
DATED : January 1, 2008
INVENTOR(S) : Lawrence S. Melvin, III et al.

It is certified that error appears in the above-identified patent and that said Letters Patent is hereby corrected as shown below:

In claim 14 (at column 13, line 26), please remove the word "computationa" and replace with the word --computational--.

Signed and Sealed this

Sixth Day of May, 2008

JON W. DUDAS
*Director of the United States Patent and Trademark Office*